United States Patent [19]

Toebben et al.

[11] Patent Number: 5,780,103
[45] Date of Patent: Jul. 14, 1998

[54] METHOD FOR FORMING OF A SILICON OXIDE LAYER ON A TOPOGRAPHY

[75] Inventors: Dirk Toebben, Fishkill, N.Y.; Doerthe Groteloh, Regeusburg, Germany; Oswald Spindler, Vaterstetten, Germany; Michael Rogalli, Rottenburg, Germany

[73] Assignee: Siemens Aktiengesellschaft, Munich, Germany

[21] Appl. No.: 771,153

[22] Filed: Dec. 20, 1996

[51] Int. Cl.$^6$ .................................................. B05D 3/02
[52] U.S. Cl. .......................... 427/226; 427/387; 427/379
[58] Field of Search ............................ 427/226, 387, 427/379

[56] References Cited

U.S. PATENT DOCUMENTS

| | | | |
|---|---|---|---|
| 4,812,588 | 3/1989 | Schrock | 556/453 |
| 5,136,069 | 8/1992 | Devries et al. | 556/453 |
| 5,138,081 | 8/1992 | Devries et al. | 556/466 |
| 5,232,970 | 8/1993 | Solc et al. | 524/404 |
| 5,264,646 | 11/1993 | Devries et al. | 585/641 |
| 5,416,233 | 5/1995 | Devries et al. | 556/479 |
| 5,491,250 | 2/1996 | Stark et al. | 556/466 |
| 5,559,055 | 9/1996 | Chang et al. | 437/195 |
| 5,567,835 | 10/1996 | Devries et al. | 556/453 |
| 5,591,677 | 1/1997 | Jeng | 437/195 |

FOREIGN PATENT DOCUMENTS 0 226 208 B1  12/1986  European Pat. Off. .

9631805  10/1996  WIPO .

OTHER PUBLICATIONS

Tacito et al. Mater. Res. Soc. Symp. Proc. (1996), 427, pp. 449–454.
Mills et al. Micro Electron. Eng. (1997), 33(1–4), 327–334.
Perettie et al. SPIE vol. 1665 (1992), 331–337.
Dibbs et al. Int. SAMPE Electron. Conf. (1992), 6, pp. 1–12.
Hahn et al. Macromolecules (1993), 26(15), 3870–7.
Garrou et al. Proc.–Electron. Compon. Technol. Conf. (1992), 42nd, 770–5.
Bothra et al. J. Electron. Mater. (1994), 23(8), 819–25.
Townsend et al. Mater. Res. Soc. Symp. Proc. (1992), 264, pp. 135–40.
Townsend et al. Mater. Res. Soc. Symp. Proc. (1994), 338, pp. 589–97.
Lii et al. Proc.–Electrochem. Soc. (1995), 95–5, pp. 266–74.
Anon., Res. Discl. (1996), 383, 213–14 (No. 38354).

*Primary Examiner*—Erma Cameron
*Attorney, Agent, or Firm*—Hill & Simpson

[57] ABSTRACT

A method for depositing an $SiO_2$ layer, which acts as an inter-metal dielectric (IMD), is provided. The method includes the steps of applying to the topography an organodisiloxane which is dissolved in an organic solvent, the organodisiloxane is then polymerized, and the polymer formed is decomposed, the polymer changing in the process to become an $SiO_2$-rich layer. The method of the present invention results in $SiO_2$ layers which achieve an excellent local and global degree of planarization and have a distinctly lower dielectric constant than $SiO_2$ layers prepared using conventional methods.

22 Claims, 2 Drawing Sheets

METHOD FOR FORMING OF A SILICON OXIDE LAYER ON A TOPOGRAPHY

BACKGROUND OF THE INVENTION

BRIEF DESCRIPTION OF THE INVENTION

The present invention relates generally to a method for preparing an $SiO_2$ layer, which acts as an inter-metal dielectric, on a topography. More specifically, the present invention relates to a method for preparing an $SiO_2$ layer on an aluminum (Al) topography.

The material used for the metallic conductor tracks in integrated circuits is almost exclusively aluminum. Because of the aluminum-silicon eutectic at 570° C., the process temperatures are confined to the range below approximately 500° C. after aluminum has been deposited on the silicon wafer. The insulating layers used between superposed aluminum planes are $SiO_2$ layers.

Such $SiO_2$ insulating layers have been generated previously using $SiO_2$ CVD (chemical vapor deposition) deposition processes. Of the commonly employed CVD deposition processes, only the so-called silane process, the LTO (low temperature oxide) process and the plasma oxide process are relevant, because the other two commonly used processes, specifically the TEOS (tetra-ethyl-ortho-silicate) process and the HTO (high temperature oxide) process take place at temperatures far above 500° C.

The main drawback of these commonly employed deposition processes is that the $SiO_2$ layers are best planarized only locally. Consequently, these layers have to be planarized by means of time consuming and labor intensive process steps which include chemical-mechanical polishing or planarizing resist etchback. However, good planarization is crucial because of the depth-of-focus requirements in the subsequent patterning steps.

Another drawback with the deposited $SiO_2$ layers is that they, as a rule, have a dielectric constant, $\epsilon$, of greater than or equal to 3.5. In the resulting integrated circuits, this relatively high dielectric constant often means that so-called "parasitic" capacitances arise which result in an increase in the signal transmission times.

Another method for generating $SiO_2$ layers is sputtering. Sputtered $SiO_2$ layers have a drawback, however, because the growth rates (approximately 1 µm per hour) are very low. Moreover, sputtering deposition often results in too high a particle incidence onto the wafers.

The step coverage achieved on topographies both by $SiO_2$ layers deposited by CVD processes and by sputtered $SiO_2$ layers are of only average quality as a rule and cause problems if the sidewalls of the aluminum patterns are very steep. Moreover, both processes require very complicated equipment.

More recently, processes have been disclosed in which so-called spin-on glass layers are generated. This involves the application of either silanols or siloxanes, dissolved in a solvent, to the topography, followed by cross-linking at elevated temperature via a polycondensation reaction. This process results in a generally good local degree of planarization, but the maximum layer thickness is limited to approximately 1 µm, due to the possibility of cracking. Further, it is not possible to achieve long-range planarization using these spin-on glass procedures.

Therefore, there is a need for the development of a method for depositing a $SiO_2$ layer, which acts as an inter-metal dielectric, on a topography, in particular an Al topography, which has both short- and long-range planarization characteristics, and which has a dielectric constant which is appreciably lower than that of deposited $SiO_2$ layers, and which can be generated with simple equipment.

SUMMARY OF THE INVENTION

The above needs are met by the present invention which provides a preparation method comprising the following steps:

a) Applying to the topography an organodisiloxane which is dissolved in an organic solvent. The organodisiloxane has the general formula $R_1(R_2)_2Si$—O—$Si(R_2)_2 R_1$, in which $R_2$ represents an alkyl radical or hydrogen and $R_1$ represents a polymerizable organic radical.

b) Polymerizing the organodisiloxane.

c) Decomposing the organodisiloxane polymer pyrolytically and/or photolytically and/or by electron irradiation, the organodisiloxane polymer thereby changing the polymer in the process to become an $SiO_2$-rich layer.

The layers thus prepared can be achieved with simple equipment, have excellent short- and long-range planarization characteristics, in particular have excellent step coverage even with aluminum patterns having very steep sidewalls, and have a dielectric constant of $\epsilon<3$. As a result, parasitic capacitances in the integrated circuits and consequently poor signal transmission times can be reduced or precluded.

Preferably, the polymerizable organic radical is a vinylcyclobutabenzene radical, and the remaining free bonds of the silicon atoms are saturated by methyl groups. This divinylsiloxane-bis-benzocyclobutene (DVS-BCB) is typically dissolved in the organic solvent mesitylene. Experience has shown that said divinylsiloxane-bis-benzocyclobutene is particularly well suited for generating $SiO_2$ layers on topographies.

Typically, the organodisiloxanes dissolved in an organic solvent are applied by means of spin-coating. Spin-coating is a particularly convenient method, in terms of equipment, and sometimes also the cheapest method of generating layers in silicon technology. However, application methods other than spin-coating, for example, roll-coating or calender coating are likewise conceivable.

Preferably, the divinylsiloxane-bis-benzocyclobutene is polymerized at a temperature of approximately 250° C. and the polymer is then decomposed in at least two successive pyrolysis cycles at a temperature of approximately 450° C. The pyrolysis cycle in this case means that the wafer is heated from room temperature to 450° C. and is then cooled back to room temperature. The decomposition of the polymer can also be accomplished by photolytical processes or by electron irradiation.

Accordingly, it is an object of the invention to provide a method for depositing an $SiO_2$ layer which acts as an inter-metal dielectric on a topography.

Yet another object of the present invention is to provide a method for depositing an $SiO_2$ layer on an Al topography.

Still another object of the present invention is to provide a method for depositing an $SiO_2$ layer which has good short- and long-range planarization characteristics.

Still another object of the present invention is to provide a method of depositing an $SiO_2$ layer which has a dielectric constant which is appreciably lower than conventionally deposited $SiO_2$ layers.

And another object of the present invention is to provide a method of depositing an $SiO_2$ layer which can be performed with straightforward and easy to obtain equipment.

Other objects and advantages of the present invention will be apparent to those skilled in the art upon reading the following detailed description and appended claims, and upon reference to the accompanying drawings.

BRIEF DESCRIPTION OF THE DRAWINGS

The invention is illustrated in the drawing by way of example and is described in detail hereinafter with reference to the drawing, in which.

It should be understood that details which are not necessary for an understanding of the present invention or which render other details difficult to perceive may have been omitted from the drawings. It should be understood, of course, that the invention is not necessarily limited to the particular embodiments illustrated herein.

DETAILED DESCRIPTION OF THE PRESENTLY PREFERRED EMBODIMENTS

Figure 1:
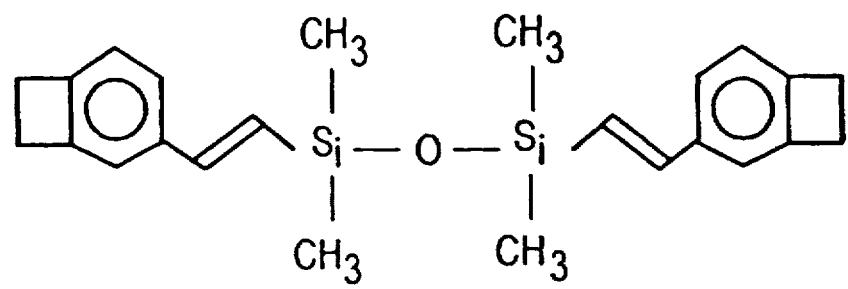
FIG. 1 illustrates a structural formula of the divinylsiloxane-bis-benzocyclobutene (DVS-BCB).
Figure 2:
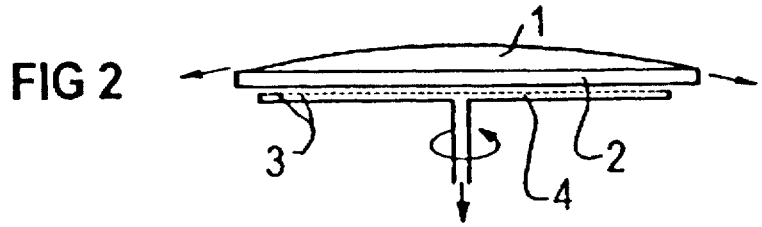
FIG. 2 illustrates a schematic illustration of a spin-coating process carried out in accordance with the present invention.

FIG. 1 shows the preferred monomer from the organodisiloxane class of substances according to the invention. The divinylsiloxane-bis-benzocyclobutene (DVS-BCB) is applied to the waver topography via spin-coating. The principle of spin-coating is illustrated in FIG. 2. The DVS-BCB 1 is first dissolved in the organic solvent mesitylene before being applied dropwise to the wafer topography 2, which is retained centrically by means of vacuum suction 3 on a spinning plate 4. Typically, the plate 4 spins at 3000 rotations per minute. As a result, the coating, which preferably contains 38% of DVS-BCB, is slung radially outward by centrifugal force and only a thin layer remains on the topography. It is followed by a drying step at approximately 250° C. on a hot plate (not shown) or in a conditioning furnace. The film formed in the process has a thickness of approximately 1.6 µm.

Figure 3:
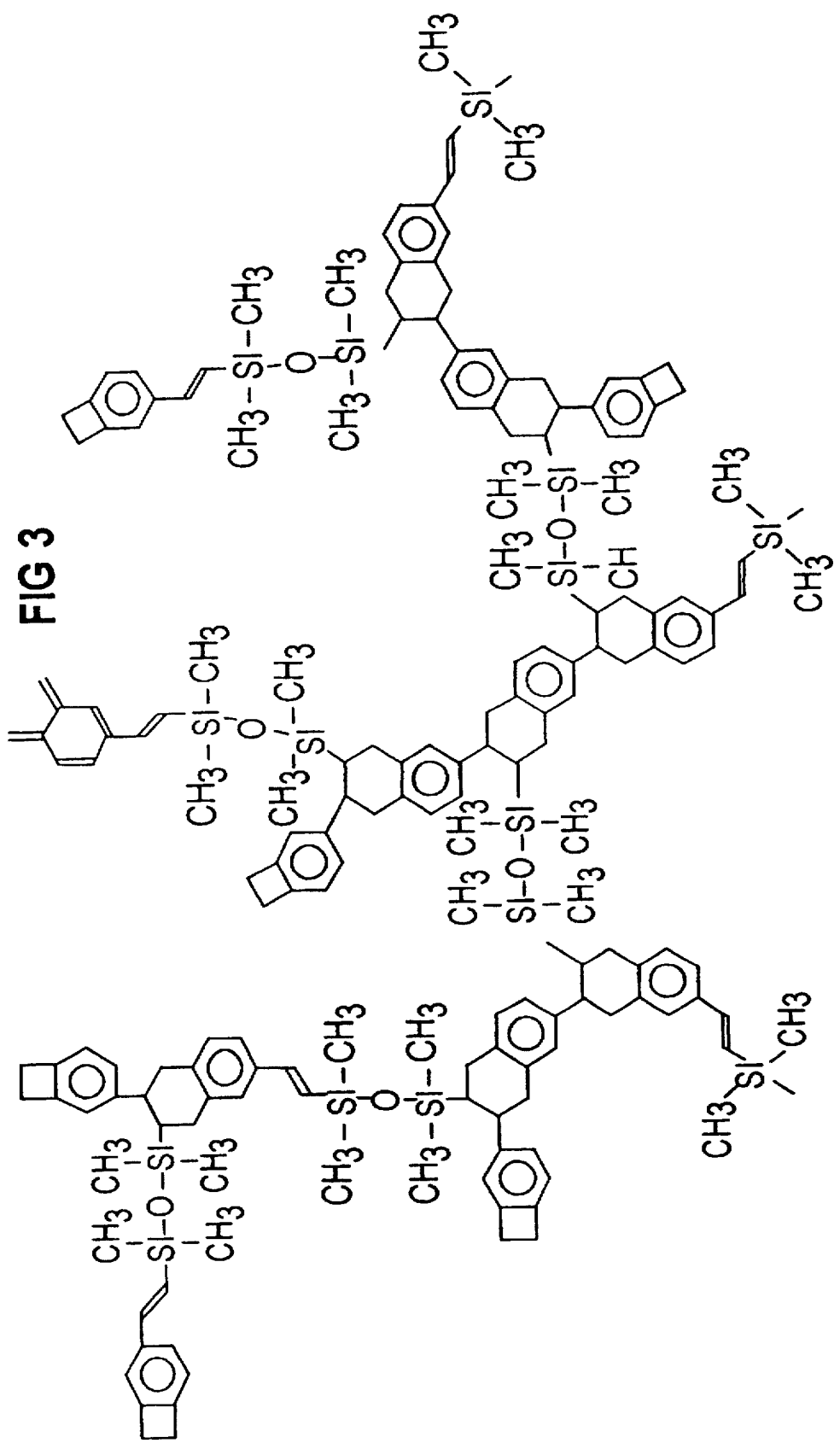
FIG. 3 illustrates the structure of the crosslinked DVS-BCB polymer used in the methods of the present invention.

FIG. 3 indicates that the monomers shown in FIG. 1 crosslink via a polymerization reaction between vinyl groups and the cyclobutene groups to give a polymer. This polymer is then decomposed in a thermal treatment at approximately 450° C., with the result that only an $SiO_2$ skeleton with a few organic residues remains. This is accompanied by a very marked reduction in film thickness. The film, whose original thickness is 1.6 µm, shrinks by about 60% in the process. The eminent short- and long-range planarization characteristics are retained, however, and a degree of polymerization of almost 90% is achieved.

Figure 4:
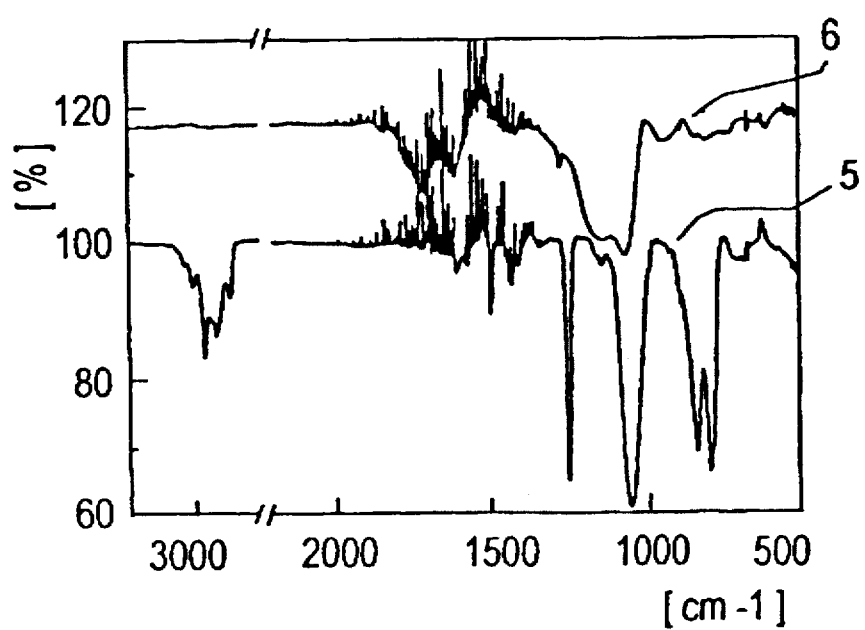
FIG. 4 illustrates infrared spectra of a DVS-BCB polymer illustrated in FIG. 3 before thermal loading and after having been subjected twice to thermal loading at 450° C.

The infrared spectra, shown in FIG. 4, of the crosslinked DVS-BCB 5 and the DVS-BCB film 6 after two thermal cycles between room temperature and 450° C. indicate that the peaks, associated with vibrations in the aromatic rings, at approximately 2900 $cm^{-1}$ and approximately 800 $cm^{-1}$ have completely disappeared. The same applies to the Si—$CH_3$ vibrations at approximately 1250 $cm^{-1}$ and approximately 850 $cm^{-1}$. At the same time, however, the Si—O—Si bending vibrations at approximately 1050 $cm^{-1}$ are retained, so that it is safe to assume that an $SiO_2$ structure has formed. This is further supported by the fact that the peak at approximately 1150 $cm^{-1}$, initially rather small, has very strongly gained in intensity. This peak can again be identified as an Si—O stretching vibration. Additionally, a small shoulder at 1150 $cm^{-1}$ is produced, which may arise from newly formed C=C bonds. The IR spectrum after thermal loading of the DVS-BCB film is strikingly similar, as a whole, to the IR spectra of CVD-$SiO_2$ and of spin-on glasses.

The organic residues and the relatively loose density of the thermally treated DVS-BCB film result in a perceptible reduction in the dielectric constant with respect to CVD-$SiO_2$. This in turn entails a noticeable reduction of parasitic capacitances in the integrated circuits fabricated therewith.

From the above description, it is apparent that the objects of the present invention have been achieved. While only certain embodiments and methods have been set forth, alternative embodiments and methods and various modifications will be apparent from the above description to those skilled in the art. These and other alternatives are considered equivalents and within the spirit and scope of the present invention.

What is claimed is:

1. A method of forming a $SiO_2$ layer on a surface comprising the following steps:

applying to the surface a solution comprising organodisiloxane and a solvent, the organodisiloxane having the general formula $R_1(R_2)_2Si$—O—$Si(R_2)_2R_1$ wherein $R_2$ is selected from the group consisting of hydrogen and an alkyl radical and wherein $R_1$ is a vinylcyclobutabenzene radical, polymerizing the organodisiloxane to form a polymer, and decomposing the polymer to form a $SiO_2$ containing layer.

2. The method of claim 1 wherein the surface is a topography.

3. The method of claim 1 wherein the surface is an aluminum topography.

4. The method of claim 1 wherein the $SiO_2$ layer is an inter-metal dielectric (IMD).

5. The method of claim 1 wherein the decomposing step is carried out pyrolytically.

6. The method of claim 1 wherein the decomposing step is carried out photolytically.

7. The method of claim 1 wherein the decomposing step is carried out by exposing the polymer to electron irradiation.

8. The method of step 1 wherein $R_2$ is a methyl radical.

9. The method of claim 1 wherein the solvent is mesitylene.

10. The method of claim 1 wherein the applying step is further characterized as being carried out using a method selected from the group consisting of spin-coating, roll-coating or calendar coating.

11. The method of claim 1 wherein the organodisiloxane is divinylsiloxane-bis-benzocyclobutene.

12. The method of claim 1 wherein the polymerization step is carried out at a temperature of about 250° C.

13. The method of claim 1 wherein the decomposing step further comprises two successive pyrolysis cycles, each successive pyrolysis cycle being carried out at a temperature of about 450° C.

14. The method of claim 1 wherein the decomposing step is carried out at a temperature of about 450° C.

15. A method of forming an inter-metal dielectric (IMD) on a topography comprising an $SiO_2$ layer, the method comprising the following steps:

applying to the topography a solution comprising organodisiloxane and a solvent, the organodisiloxane having the general formula $R_1(R_2)_2Si-O-Si(R_2)_2R_1$ wherein $R_2$ is selected from the group consisting of hydrogen and an alkyl radical and wherein $R_1$ is a vinylcyclobutabenzene radical, polymerizing the organodisiloxane to form a polymer, and decomposing the polymer to form a $SiO_2$ containing layer.

16. The method of step 15 wherein $R_2$ is a methyl radical.

17. The method of claim 15 wherein the solvent is mesitylene.

18. The method of claim 15 wherein the applying step is further characterized as being carried out by spin-coating.

19. The method of claim 15 wherein the organodisiloxane is divinylsiloxane-bis-benzocyclobutene.

20. A method of forming an inter-metal dielectric (IMD) on a surface comprising an $SiO_2$ layer and having a dielectric constant of less than 3.5, the method comprising the following steps:

spin-coating onto the surface a solution comprising organodisiloxane and a mesitylene, the organodisiloxane having the general formula $R_1(R_2)_2Si-O-Si(R_2)_2R_1$ wherein $R_2$ is selected from the group consisting of hydrogen and an alkyl radical and wherein $R_1$ is a vinylcyclobutabenzene radical, polymerizing the organodisiloxane to form a polymer, and decomposing the polymer to form a $SiO_2$ containing layer.

21. The method of claim 15 wherein the decomposing step further comprises two successive pyrolysis cycles, each successive pyrolysis cycle being carried out at a temperature of about 450° C.

22. The method of claim 20 wherein the decomposing step further comprises two successive pyrolysis cycles, each successive pyrolysis cycle being carried out at a temperature of about 450° C.

* * * * *